(12) United States Patent
Itaya

(10) Patent No.: US 9,733,277 B2
(45) Date of Patent: Aug. 15, 2017

(54) VOLTAGE MONITORING CONTROL DEVICE, VOLTAGE CONTROL DEVICE, AND VOLTAGE MONITORING CONTROL METHOD

(71) Applicant: Nobuhiko Itaya, Tokyo (JP)

(72) Inventor: Nobuhiko Itaya, Tokyo (JP)

(73) Assignee: MITSUBISHI ELECTRIC CORPORATION, Chiyoda-Ku, Tokyo (JP)

( * ) Notice: Subject to any disclaimer, the term of this patent is extended or adjusted under 35 U.S.C. 154(b) by 197 days.

(21) Appl. No.: 14/429,155

(22) PCT Filed: Nov. 26, 2012

(86) PCT No.: PCT/JP2012/080444
§ 371 (c)(1),
(2) Date: Mar. 18, 2015

(87) PCT Pub. No.: WO2014/080514
PCT Pub. Date: May 30, 2014

(65) Prior Publication Data
US 2015/0233975 A1 Aug. 20, 2015

(51) Int. Cl.
*G01R 15/18* (2006.01)
*H02J 4/00* (2006.01)
*G01R 19/165* (2006.01)

(52) U.S. Cl.
CPC ....... *G01R 15/18* (2013.01); *G01R 19/16528* (2013.01)

(58) Field of Classification Search
CPC .......... G01R 19/16547; G01R 19/0084; G01R 19/2513; G01R 15/18; G01R 31/027; H02J 4/00
(Continued)

(56) References Cited

U.S. PATENT DOCUMENTS

2009/0312881 A1  12/2009  Venturini Chelm et al.
2010/0125373 A1*  5/2010  Labuschagne ........ H02J 3/1878
                                                                  700/293
(Continued)

FOREIGN PATENT DOCUMENTS

JP         60-241725 A   11/1985
JP          5-276663 A   10/1993
(Continued)

OTHER PUBLICATIONS

International Search Report (PCT/ISA/210) mailed on Jan. 22, 2013, by the Japanese Patent Office as the International Searching Authority for International Application No. PCT/JP2012/080444.
(Continued)

*Primary Examiner* — Arleen M Vazquez
*Assistant Examiner* — Neel Shah
(74) *Attorney, Agent, or Firm* — Buchanan Ingersoll & Rooney PC

(57) ABSTRACT

A centralized voltage control device connected, via a communication network, to local voltage control devices connected to voltage control apparatuses, including: a transmission and reception unit receiving the number of times a tap position is changed per fixed time of the voltage control apparatus from the local voltage control device; a dead-zone-width updating unit increasing a dead zone width when the number of times a tap position is changed in a voltage control apparatus of a transformer type is a threshold or larger; and a voltage-upper-and-lower-limit-value determining unit determining the voltage upper limit value and the voltage lower limit value for each local voltage control device and issuing a command regarding these values to each local voltage control device, and determining the voltage upper limit value and the voltage lower limit value
(Continued)

of the voltage control apparatus of a transformer type on the basis of the dead zone width.

15 Claims, 6 Drawing Sheets

(58) Field of Classification Search
USPC .......... 324/126, 127, 547; 307/82; 323/324
See application file for complete search history.

(56) References Cited

U.S. PATENT DOCUMENTS

2013/0134779 A1\* 5/2013 Watanabe ................ G05F 1/70
307/24
2015/0168478 A1\* 6/2015 Ohlen .................. G01R 31/027
324/547

FOREIGN PATENT DOCUMENTS

| JP | 9-154235 A | 6/1997 |
| JP | 9-322404 A | 12/1997 |
| JP | 11-289663 A | 10/1999 |
| JP | 11-289664 A | 10/1999 |
| JP | 2002-165367 A | 6/2002 |
| JP | 2005-269744 A | 9/2005 |
| JP | 2006-254602 A | 9/2006 |
| JP | 2008-544381 A | 12/2008 |
| JP | 2009-65788 A | 3/2009 |
| JP | 2009-177868 A | 8/2009 |

OTHER PUBLICATIONS

Written Opinion (PCT/ISA/237) mailed on Jan. 22, 2013, by the Japanese Patent Office as the International Searching Authority for International Application No. PCT/JP2012/080444.

\* cited by examiner

VOLTAGE MONITORING CONTROL DEVICE, VOLTAGE CONTROL DEVICE, AND VOLTAGE MONITORING CONTROL METHOD

FIELD

The present invention relates to a voltage monitoring control device, a voltage control device, and a voltage monitoring control method.

BACKGROUND

In general, a power distribution system is configured from a high voltage system (e.g., 3300 volts to 6600 volts) and a low voltage system (e.g., 100 volts to 200 volts). Power receiving ends of general consumers are connected to the low voltage system. Power companies are obligated to maintain the voltage at the power receiving ends of the general consumers within a proper range (e.g., in the case of power reception of 100 volts, the voltage is maintained at 95 volts to 107 volts). Therefore, the power companies attain the voltage maintenance at the power receiving ends of the general consumers by adjusting the amount of control of voltage control apparatuses (e.g., LRTs (Load Ratio Control Transformers) or SVRs (Step Voltage Regulators)) connected to the high voltage system (e.g., by operating taps). Note that, in the following explanation, the power distribution system indicates the high voltage system thereof unless specifically noted otherwise.

Conventionally, concerning the voltage control of the power distribution system, a local voltage control device integrated or juxtaposed with a voltage control apparatus of a transformer type such as an LRT or an SVR is widely spread. The local voltage control device performs, in an autonomous distributed manner, voltage control of the voltage control apparatus on the basis of measurement information (a voltage and a power flow) near the setting point of the voltage control apparatus. Note that, as the voltage control apparatus, besides the voltage control apparatus of the transformer type, there has been known a voltage control apparatus of a reactive power control type such as a phase modification facility (a phase advance capacitor, a branch reactor, etc.) having a function of automatically switching between operation and non-operation, an SVC (static Var Compensator), or a PCS (Power Conditioning System) with a reactive power adjusting function is known. Local voltage control devices respectively corresponding to these voltage control apparatuses are also in the stage of practical use. The PCS is, for example, a power conditioner for solar power generation and connects a solar power generation facility or a storage battery and a power distribution system.

These local voltage control devices are configured on the premise that fluctuations in load distribution of the power distribution system are uniform, that is, the voltage at each power distribution system point changes in the same direction over time. However, in recent years, for example, with the diversification of the ways of using electricity and the spread of distributed power supplies due to solar power generation and the like, the load distribution of the power distribution system tends to non-uniformly and largely fluctuate over time. Therefore, it is becoming difficult to maintain a proper voltage with the voltage control of the conventional power distribution system.

Therefore, instead of the voltage control system of the autonomous distribution type, it has been proposed to provide centralized control of the voltage of the power distribution system in a consistent form over the entire system (a centralized control system). Specifically, a mechanism has been proposed in which measurement information (voltages and power flow) at a plurality of points in the power distribution system is collected in a centralized voltage control device using a dedicated network, the centralized voltage control device determines the amount of control (reactive power, etc.) of each voltage control apparatus on the basis of these pieces of measurement information, and the centralized voltage control device automatically and remotely issues a command regarding the amount of control to each voltage control apparatus (see, for example, Patent Literature 1).

CITATION LIST

Patent Literature

Patent Literature 1: Japanese Patent Application Laid-Open No. H9-322404

SUMMARY

Technical Problem

However, in recent years, low-voltage system interconnections of distributed power supplies by solar power generation are increasing year after year. It is assumed that, for example, a solar power generation amount greatly changes because of a sudden change in the amount of solar radiation due to the movement of clouds when the weather is fine and a voltage change of the power distribution system due to the change in the solar power generation amount reaches a non-negligible level. The centralized voltage control device collects measurement information on voltage and power flow at each power distribution system point and assigns optimum control to each voltage control apparatus. However, because planning of the optimum control is performed on the basis of measurement information on voltage and power flow at the point of the planning, when a large amount of solar power generation is interconnected with the low voltage system, problems explained below are anticipated.

(1) If the measurement monitoring cycle is set long (e.g., about several tens of minutes), for example, when a solar power generation amount greatly changes because of a sudden change in the amount of solar radiation due to the movement of clouds, it is impossible to follow sudden voltage fluctuations.

(2) In contrast, if the measurement monitoring cycle is set short (e.g., about several minutes or less), because a communication load for measurement monitoring increases, enormous capital investment in a communication network is required.

On the other hand, the local voltage control device of the transformer type controls the tap position so as to keep the voltage between the voltage upper limit value and the voltage lower limit value. Therefore, when the difference between the voltage upper limit value and the voltage lower limit value of the local voltage control device of the transformer type is small, there is a problem in that the local voltage control device changes the tap position frequently and the life of the tap device is reduced.

The present invention has been devised in view of the above and it is an object of the present invention to obtain a voltage monitoring control device, a voltage control device, and a voltage monitoring control method that can maintain a voltage following voltage fluctuations of a power distribution system and reduce the number of times the tap position is changed without increasing a communication load.

Solution to Problem

In order to solve the above problems and achieve the object, the present invention relates to a voltage monitoring control device that is connected to each of a plurality of local voltage control devices via a communication network, the local voltage control devices being respectively connected to a plurality of voltage control apparatuses that are connected to a power distribution line of a high voltage system and control a voltage of the power distribution line and adjusting an amount of control of the voltage control apparatuses every second cycle that is shorter than a first cycle such that a voltage value controlled by the voltage control apparatuses is maintained within a range between a voltage upper limit value and a voltage lower limit value that are updated every first cycle, including: a transmission and reception unit that receives number of times a tap position is changed within determined time or the number of times a tap position is changed per fixed time concerning a voltage control apparatus of a transformer type, which controls a voltage by changing a tap position, among the voltage control apparatuses to which the local voltage control devices are connected, the number of times a tap position is changed being transmitted from the local voltage control devices; a dead-zone-width updating unit that increases, concerning the voltage control apparatus of a transformer type, a dead zone width, which is a width of a range between the voltage upper limit value and the voltage lower limit value of the voltage control apparatus, when the number of times a tap position is changed within the determined time or the number of times a tap position is changed per fixed time is equal to or larger than a threshold; and a voltage-upper-and-lower-limit-value determining unit that determines the voltage upper limit value and the voltage lower limit value that are updated every first cycle in each of the local voltage control devices and issues a command regarding the voltage upper limit value and the voltage lower limit value to each of the local voltage control devices via the communication network.

Advantageous Effects of Invention

According to the present invention, there is an effect that it is possible to maintain a voltage following voltage fluctuations of a power distribution system and reduce the number of times the tap position is changed without increasing a communication load.

DESCRIPTION OF EMBODIMENTS

Exemplary embodiments of a voltage monitoring control device, a voltage control device, and a voltage monitoring control method according to the present invention will be explained in detail below with reference to the drawings. Note that the present invention is not limited to the embodiments.

Embodiment

Figure 1:
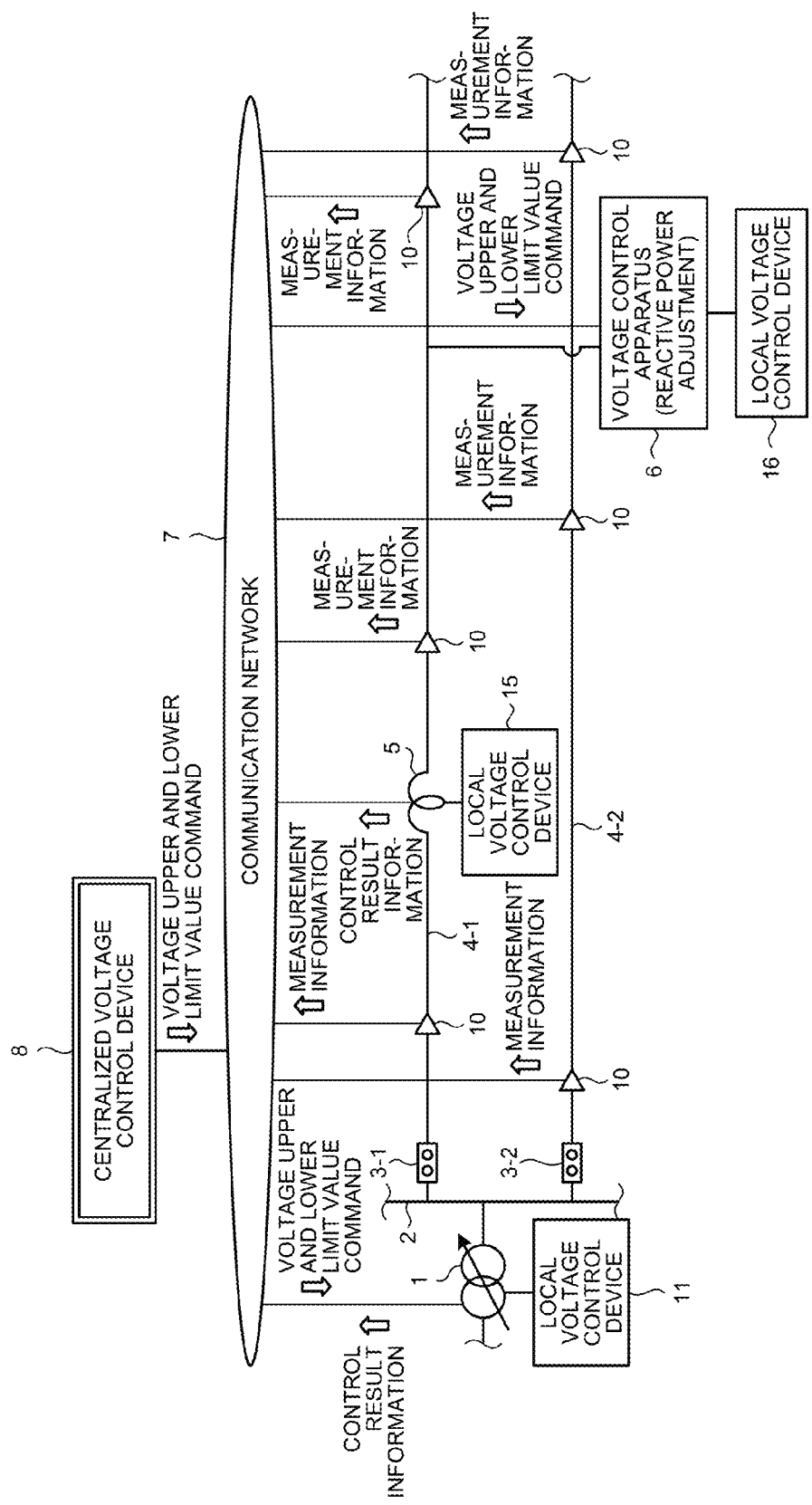
FIG. 1 is a diagram of an example of the configuration of a power-distribution-system voltage control system according to an embodiment of the present invention.

FIG. 1 is a diagram of an example of the configuration of a power-distribution-system voltage control system according to an embodiment of the present invention. In FIG. 1, a voltage control apparatus 1 is, for example, an LRT (Load Ratio Control Transformer) functioning as a transformer for power distribution set in a transformer substation. A local voltage control device 11 is connected to the voltage control apparatus 1. The local voltage control device 11 controls the voltage control apparatus 1. For example, the local voltage control device (a voltage control device) 11 can be integrated or juxtaposed with the voltage control apparatus 1. The local voltage control device 11 controls the voltage control apparatus 1 by adjusting the amount of control of the voltage control apparatus 1, specifically, by adjusting the tap position. The local voltage control device 11 has a communication function and is connected to a communication network 7.

A bus 2 is connected to the secondary side of the voltage control apparatus 1. For example, two power distribution lines 4-1 and 4-2 are connected to the bus 2 in parallel. The power distribution lines 4-1 and 4-2 are power distribution lines of a high voltage system (the voltage level is, for example, 3300 volts to 6600 volts).

One end of the power distribution line 4-1 is connected to the bus 2 via a breaker 3-1. Voltage-and-power-flow measuring devices 10, each of which measures a voltage and a power flow of the power distribution line 4-1, are set in a plurality of places on the power distribution line 4-1, respectively. That is, the voltage-and-power-flow measuring devices 10 are connected to the power distribution line 4-1, measure voltages and power flows in places of the connection, and output measured values of the voltages and the power flows as measurement information. The voltage-and-power-flow measuring devices 10 have a communication function and are connected to the communication network 7. The voltage-and-power-flow measuring devices 10 transmit the measurement information to a centralized voltage control device 8, for example, periodically via the communication network 7.

A voltage control apparatus 5, which is an SVR (Step Voltage Regulator) for voltage drop compensation, is provided on the power distribution line 4-1. A local voltage control device 15, which controls the voltage control apparatus 5, is connected to the voltage control apparatus 5. For example, the local voltage control device 15 can be integrated or juxtaposed with the voltage control apparatus 5. The local voltage control device 15 controls the voltage control apparatus 5 by adjusting the amount of control of the voltage control apparatus 5, specifically, by adjusting the tap position. The local voltage control device 15 has a communication function and is connected to the communication network 7.

On the power distribution line 4-1, a voltage control apparatus 6, which is a static var compensator (SVC), is connected. A local voltage control device 16, which controls the voltage control apparatus 6, is connected to the voltage control apparatus 6. For example, the local voltage control device 16 can be integrated or juxtaposed with the voltage control apparatus 6. The local voltage control device 16 controls the voltage control apparatus 6 by adjusting the amount of control of the voltage control apparatus 6, specifically, by adjusting the reactive power output. The local voltage control device 16 has a communication function and is connected to the communication network 7.

One end of the power distribution line 4-2 is connected to the bus 2 via a breaker 3-2. As in the power distribution line 4-1, the voltage-and-power-flow measuring devices 10, each of which measures a voltage and a power flow of the power distribution line 4-2, are set in a plurality of places on the power distribution line 4-2, respectively.

The power distribution lines 4-1 and 4-2 are power distribution lines of a high voltage system. Although not shown in the figure, low-voltage power distribution lines configuring a low voltage system (the voltage level is, for example, 100 volts to 200 volts) are respectively connected to the power distribution lines 4-1 and 4-2 via transformers. Loads are connected to the low-voltage power distribution lines. Further, a distributed power supply such as a solar power generation device is connected to the low-voltage power distribution lines. That is, in the present embodiment, the distributed power supply is interconnected to the low voltage system. However, the present embodiment can also be applied even when the distributed power supply is not included in the low voltage system. In the following explanation, the power distribution system means a high voltage system unless specifically noted otherwise. Note that, in the following explanation, for example, the distributed power supply is explained with reference to a solar power generation device as an example. Voltage control of the power distribution system means voltage control of the high voltage system. The power distribution system includes the voltage control apparatuses 1, 5, and 6, the local voltage control devices 11, 15, and 16, the bus 2, the breakers 3-1 and 3-2, the power distribution lines 4-1 and 4-2, and the voltage-and-power-flow measuring devices 10.

Note that, in the example shown in the figure, the number of power distribution lines connected to the bus 2 is two. However, the number of power distribution lines is not limited to this example. The number of set voltage control apparatuses is not limited to the example shown in the figure either. As the voltage control apparatuses, besides the LRT, SVR, SVC, and the like illustrated in FIG. 1, for example, an ShR (Shunt Reactor), a PCS (Power Conditioning System) with a reactive power adjusting function, and the like can be provided according to the configuration.

The centralized voltage control device (a voltage monitoring control device) 8 is connected to each of the local voltage control devices 11, 15, and 16 and a plurality of the voltage-and-power-flow measuring devices 10 via the communication network 7. The communication network 7 is, for example, a dedicated network and is disposed for the purpose of monitoring and controlling the power distribution system. The centralized voltage control device 8 determines, on the basis of, for example, measurement information transmitted from the voltage-and-power-flow measuring devices 10, a voltage upper limit value and a voltage lower limit value (hereinafter also referred to as voltage upper and lower limit values) for specifying a voltage range set as a target controlled by each local voltage control device, for example, every centralized control cycle (e.g., one-hour cycle), and issues a command regarding the voltage upper and lower limit values to each local voltage control device via the communication network 7. The centralized voltage control device 8 acquires control result information from the local voltage control devices 11 and 15 connected to the voltage control apparatuses of a transformer type, which adjust a voltage by controlling the tap position, and adjusts, on the basis of the control result information, the dead zone width for determining the difference between the voltage upper limit value and the voltage lower limit value.

Each local voltage control device controls, on the basis of the command regarding the voltage upper and lower limit values from the centralized voltage control device 8, the voltage control apparatus that is a control target of the local voltage control device, so as to maintain a voltage between the voltage upper and lower limit values. Every time each local voltage control device receives the command regarding the voltage upper and lower limit values from the centralized voltage control device 8, the local voltage control device updates and sets the voltage upper limit value and the voltage lower limit value. For example, the local voltage control device 11 adjusts, on the basis of the voltage upper and lower limit value command received from the centralized voltage control device 8, the amount of control (the amount of change of the tap position) of the voltage control apparatus 1 every local control cycle (second cycle) that is shorter than the centralized control cycle such that the voltage on the secondary side of the voltage control apparatus 1 falls between the voltage upper and lower limit values (within a control target voltage range) during the period of the centralized control cycle in which the voltage upper and lower limit values are used. For example, the local voltage control device 16 adjusts, on the basis of the voltage upper and lower limit value command received from the centralized voltage control device 8, the amount of control of the voltage control apparatus 6 every local control cycle (second cycle) that is shorter than the centralized control cycle (first cycle) such that the voltage at a point where the voltage control apparatus 6 is interconnected with the power distribution system falls between the voltage upper and lower limit values (within the control target voltage range) during the period of the centralized control cycle in which the voltage upper and lower limit values are used.

Further, among the local voltage control devices, the local voltage control devices that control the voltage control apparatuses of the transformer type (in the example shown in FIG. 1, the voltage control apparatus 1 and the voltage control apparatus 5), which adjust the voltage by controlling the tap position, record the number of times the tap position is changed as a control result and transmit the number of times the tap position is changed within a determined time (e.g., one day) in the most recent past to the centralized voltage control device 8 through the communication network 7. That is, among the local voltage control devices, the local voltage control devices that control the voltage control apparatuses of the transformer type (in the example shown in FIG. 1, the voltage control apparatus 1 and the voltage control apparatus 5), which adjust the voltage by controlling the tap position, each include a control unit that adjusts the amount of control of the control target voltage control apparatus every local control cycle on the basis of the voltage upper and lower limit value command received from the centralized voltage control device 8 and a control-result transmitting unit that counts the number of times the tap position is changed per fixed time in the voltage control apparatus and transmits the number of times the tap position is changed to the centralized voltage control device 8.

Figure 2:
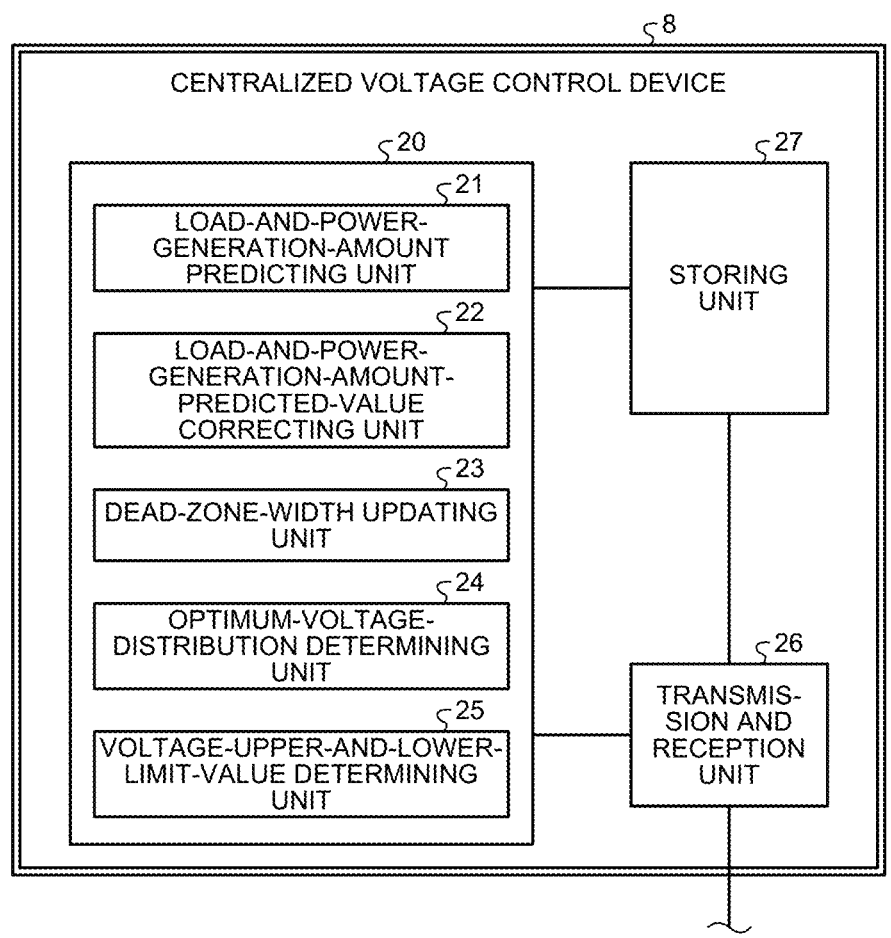
FIG. 2 is a diagram of an example of the internal configuration of a centralized voltage control device.

FIG. 2 is a diagram of an example of the internal configuration of the centralized voltage control device 8. As shown in FIG. 2, the centralized voltage control device 8 includes a control unit 20, a storing unit 27 connected to the control unit 20, and a transmission and reception unit 26 connected to the control unit 20, the storing unit 27, and the communication network 7.

The control unit 20 includes, as functional components thereof, a load-and-power-generation-amount predicting unit 21, a load-and-power-generation-amount-predicted-value correcting unit 22, a dead-zone-width updating unit 23, an optimum-voltage-distribution determining unit 24, and a voltage-upper-and-lower-limit-value determining unit 25. The load-and-power-generation-amount predicting unit 21 predicts, for example, every centralized control cycle (e.g., one-hour cycle), a load/power generation amount distribution of the power distribution system in future such as the next day. Note that details of a method of predicting the load/power generation amount distribution will be explained later. The load-and-power-generation-amount-predicted-value correcting unit 22 corrects the predicted value of the load/power generation amount distribution within the period of the centralized control cycle on the basis of the comparison result of the actual value of the load/power generation amount distribution within a period of the centralized control cycle immediately preceding the period and the predicted value of the load/power generation amount distribution within the period. The actual value of the load/power generation amount distribution is calculated on the basis of measurement information (a voltage and a power flow).

The dead-zone-width updating unit 23 updates the dead zone width of the voltage control apparatuses of the transformer type (the voltage control apparatuses 1 and 5) on the basis of the control result information. Specifically, the transmission and reception unit 26 receives the control result information from the local voltage control devices 11 and 15 and passes the control result information to the dead-zone-width updating unit 23. The dead-zone-width updating unit 23 updates the dead zone width on the basis of the control result information and the like. The update of the dead zone width will be explained later.

The optimum-voltage-distribution determining unit 24 performs power flow calculation on the basis of the corrected predicted value of the load/power generation amount distribution and searches for, taking into account the dead zone width of the voltage control apparatuses of the transformer type, the best solution for optimizing a value of an evaluation function for evaluating a voltage distribution of the power distribution system to thereby determine an optimum voltage distribution and an optimum amount of control of each voltage control apparatus within the period of the centralized control cycle.

The voltage-upper-and-lower-limit-value determining unit 25 determines, on the basis of the determined optimum voltage distribution, voltage upper and lower limit values, which are an upper limit and a lower limit, within a control target voltage range of each local voltage control device within the period of the centralized control cycle and issue a command regarding the voltage upper and lower limit values to each local voltage control device via the communication network 7. Note that details of processing for determining the voltage upper and lower limit values by the voltage-upper-and-lower-limit-value determining unit 25 will be explained later. The overview of the processing is as follows.

First, the voltage-upper-and-lower-limit-value determining unit 25 acquires, from the storing unit 27, information concerning a voltage control responsible range assigned to each of the local voltage control devices in advance. The voltage control responsible range is a range (or a section) on the power distribution line 4-1 or 4-2 and is a range in which the local voltage control device to which the range is assigned or the voltage control apparatus connected to the local voltage control device is responsible for the control of a voltage in the range.

A voltage control apparatus of a reactive power control type sets, when the voltage control apparatus of the transformer type is present on the power supply side (upstream side) of the voltage control apparatus, a range up to the load side (downstream side) of the transformer of the voltage control apparatus of the transformer type and a range on the load side (downstream side) of the voltage control apparatus as the voltage control responsible range. The voltage control apparatus of the reactive power control type includes, when still another voltage control apparatus is present on the load side (downstream side), a range up to the power supply side (upstream side) of the other voltage control apparatus in the voltage control responsible range. The voltage control apparatus of the transformer type sets, for example, the load side (downstream side) of the transformer as the voltage control responsible range. However, when another voltage control apparatus is present on the load side, the voltage control apparatus on the transformer type sets a range up to the power supply side (upstream side) of the other voltage control apparatus as the voltage control responsible range of the voltage control apparatus. Note that a method for setting the voltage control responsible range is not limited to the example explained above.

A proper voltage range is set in advance for each of the voltage control responsible ranges. The proper voltage range is a proper voltage range that the high voltage system should maintain. An optimum voltage of the voltage control apparatus is calculated so as to fall within the proper voltage range of the voltage control responsible range of the voltage control apparatus. The difference between the optimum voltage and the lower limit value of the proper voltage is referred to as a voltage lower limit margin. The difference between the upper limit value of the proper voltage and the optimum voltage is referred to as a voltage upper limit margin. The voltage-upper-and-lower-limit-value determining unit 25 determines, for the local voltage control device that controls the voltage control apparatus of the transformer type, voltage upper and lower limit values on the basis of the optimum voltage and the dead zone width. The voltage-upper-and-lower-limit-value determining unit 25 determines, for the local voltage control device that controls the voltage control apparatus of the reactive power adjustment type, voltage upper and lower limit values as explained below on the basis of the voltage lower limit margin and the voltage upper limit margin. The voltage-upper-and-lower-limit-value determining unit 25 selects a minimum voltage upper limit margin among the volte upper limit margins within the voltage control responsible range of the local voltage control device and selects a minimum voltage lower limit margin among the voltage lower limit margins within the voltage control responsible range. The voltage-upper-and-lower-limit-value determining unit 25 determines, as a voltage upper limit value of a control target voltage range, a voltage obtained by adding the minimum voltage upper limit margin within the voltage control responsible range to the optimum voltage of the voltage control apparatus and determines, as a voltage lower limit value of the control target voltage range, a voltage obtained by subtracting the minimum voltage lower limit margin within the voltage control responsible range from the optimum voltage of the voltage control apparatus.

The centralized voltage control device 8 can be configured as, for example, a server including a CPU, a memory, a storage device such as a hard disk, and a communication function. The control unit 20 is realized by a CPU that performs control processing according to a control program stored in the memory. The storing unit 27 collectively represents the memory, the storage device, and the like. The transmission and reception unit 26 represents the communication function. Note that the centralized voltage control device 8 can be set in, for example, a transformer substation.

In general, the voltage control apparatus of the transformer type sets upper and lower dead zones having equal width for a voltage that is a target value of control, and controls the voltage such that it falls in the dead zone on the upper side or the lower side. In the present embodiment, the dead zone width, which is the width of the range between the voltage upper limit value and the voltage lower limit value, is set for each of the voltage control apparatuses of the transformer type. An optimum voltage distribution is determined taking into account the dead zone width. Therefore, concerning the voltage control apparatus of the transformer type, the voltage upper limit value is a value obtained by adding a half of the dead zone width to the optimum voltage and the voltage lower limit value is a value obtained by subtracting a half of the dead zone width from the optimum voltage.

In the present embodiment, an optimum voltage distribution is calculated and voltage upper and lower limit values, which are an upper limit and a lower limit, of a control target range of each local voltage control device are determined on the basis of the result of the calculation of the optimum voltage distribution. Each local voltage control device carries out control on the basis of the voltage upper and lower limit values. The voltage control apparatus of the transformer type controls a voltage by operating the tap position. Therefore, when the difference between the voltage upper limit value and the voltage lower limit value is small, the number of times the tap position is changed increases and the life of a tap device is reduced. Therefore, in the present embodiment, the dead zone width is controlled such that it has an appropriate value so as to prevent the number of times the tap position is changed from excessively increasing.

Figure 3:
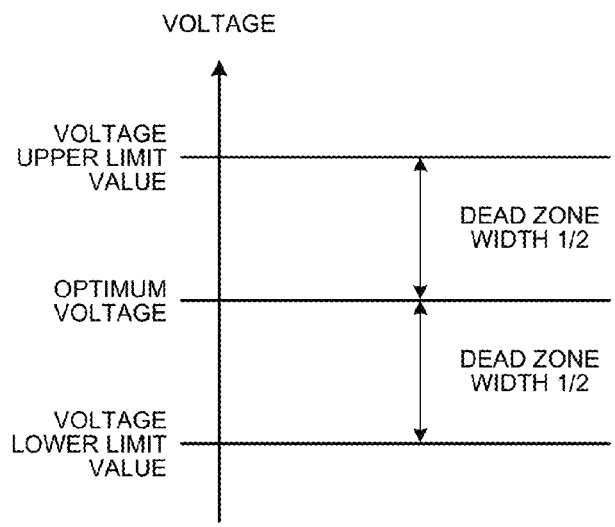
FIG. 3 is a diagram for explaining a dead zone width.
Figure 4:
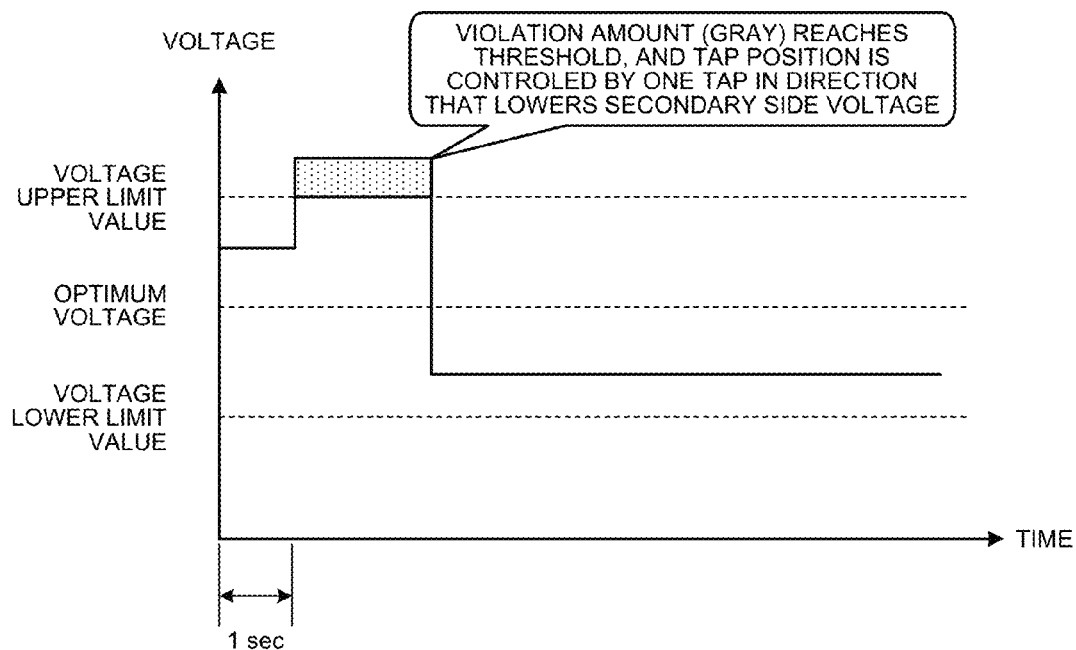
FIG. 4 is a diagram for explaining the concept of control of the dead zone width.

FIG. 3 is a diagram for explaining the dead zone width. In FIG. 3, the secondary side voltage of each voltage control apparatus of the transformer type is shown. The dead zone width is the width of the range between the voltage upper limit value and the voltage lower limit value. Upper and lower halves of the dead zone width are set for the optimum voltage and the voltage upper limit value and the voltage lower limit value are determined. FIG. 4 is a diagram for explaining the concept of control of the dead zone width. In FIG. 4, a control example of each voltage control apparatus (transformer) by the local voltage control device is shown according to the change of the secondary side voltage over time.

As shown in FIG. 4, when the amount of deviation (amount of violation) from the proper voltage reaches a threshold, the local voltage control device changes the tap position by one tap in a direction that lowers the secondary side voltage. When the dead zone width is reduced, the amount of violation shown in FIG. 4 reaches the threshold more frequently and the number of times the tap position is changed increases. Therefore, in the present embodiment, the centralized voltage control device 8 acquires the number of times the tap position is changed from each local voltage control device as control result information, and, when the number of times the tap position is changed per fixed time is equal to or larger than a threshold, the centralized voltage control device 8 widens (increases) the dead zone width.

On the other hand, when the dead zone width is set too large, deviation from the proper voltage (voltage violation) easily occurs. Therefore, when voltage violation occurs, the centralized voltage control device 8 narrows the dead zone width. To prevent hunting of a tap change due to changing operation itself of the tap position (e.g., a situation in which voltage lower limit value violation occurs when the voltage is lowered by tap operation in order to avoid voltage upper limit value violation), the dead zone width needs to be at least the voltage fluctuation by one-tap change.

A standard value (an initial value) of the dead zone width can be set to, for example, a value equal to twice the voltage fluctuation by one-tap change so that voltage violation is detected and voltage returns to near the optimum voltage by one-tap operation. When the dead zone width is increased to four times the voltage fluctuation by one-tap change, two-tap change is necessary to detect voltage violation and return the voltage to the optimum voltage. Therefore, based on the change by one tap at a time, the maximum of the dead zone width can be set to four times the voltage fluctuation by one-tap change. However, because the maximum of the dead zone width depends on the voltage fluctuation of the power distribution system, an actual control method, and the like, a method for determining the maximum of the dead zone width is not limited to this. Further, the maximum of the dead zone width does not have to be set.

When the dead zone width is set large, a solution is not obtained in some cases in the calculation of the optimum voltage distribution. In such a case, the dead zone width is narrowed.

A method of widening and a method of narrowing the dead zone width are not particularly limited. However, for example, the dead zone width can be widened or narrowed in units of fixed amount. Not only this, but a method of, for example, widening the dead zone width to a maximum at a time or narrowing the dead zone width to a minimum at a time can be adopted. The fixed ratio for widening or narrowing the dead zone width, for example, widening the dead zone width to 1.1 times or narrowing the dead zone width to 0.9 times, can be specified in advance. The update cycle (third cycle) of the dead zone width can be set to, for example, one day, one week, or one hour and can coincide with or does not have to coincide with the centralized control cycle. When the update cycle of the dead zone width is set short (e.g., one hour), the amount by which the dead zone width is widened at a time is desirably set small.

Each local voltage control device that controls the voltage control apparatus of the transformer type transmits the number of times the tap position is changed within a predetermined time (e.g., one day), which is determined time. However, the predetermined time only has to be equal to or shorter than the update cycle of the dead zone width. The predetermined time and the update cycle of the dead zone width can coincide with each other or do not have to coincide with each other. For example, the predetermined time and the update cycle of the dead zone width can be set to one day. When transmitting other data, each local voltage control device can transmit the number of times the tap position is changed together. The predetermined time can be always fixed or can be changed. For example, when regular transmission is performed twice a day at 10 o'clock or 20 o'clock, each local voltage control device can transmit the number of times the tap is changed within fourteen hours or within ten hours. Each local voltage control device can also transmit the number of times the tap position is changed per fixed time.

Figure 5:
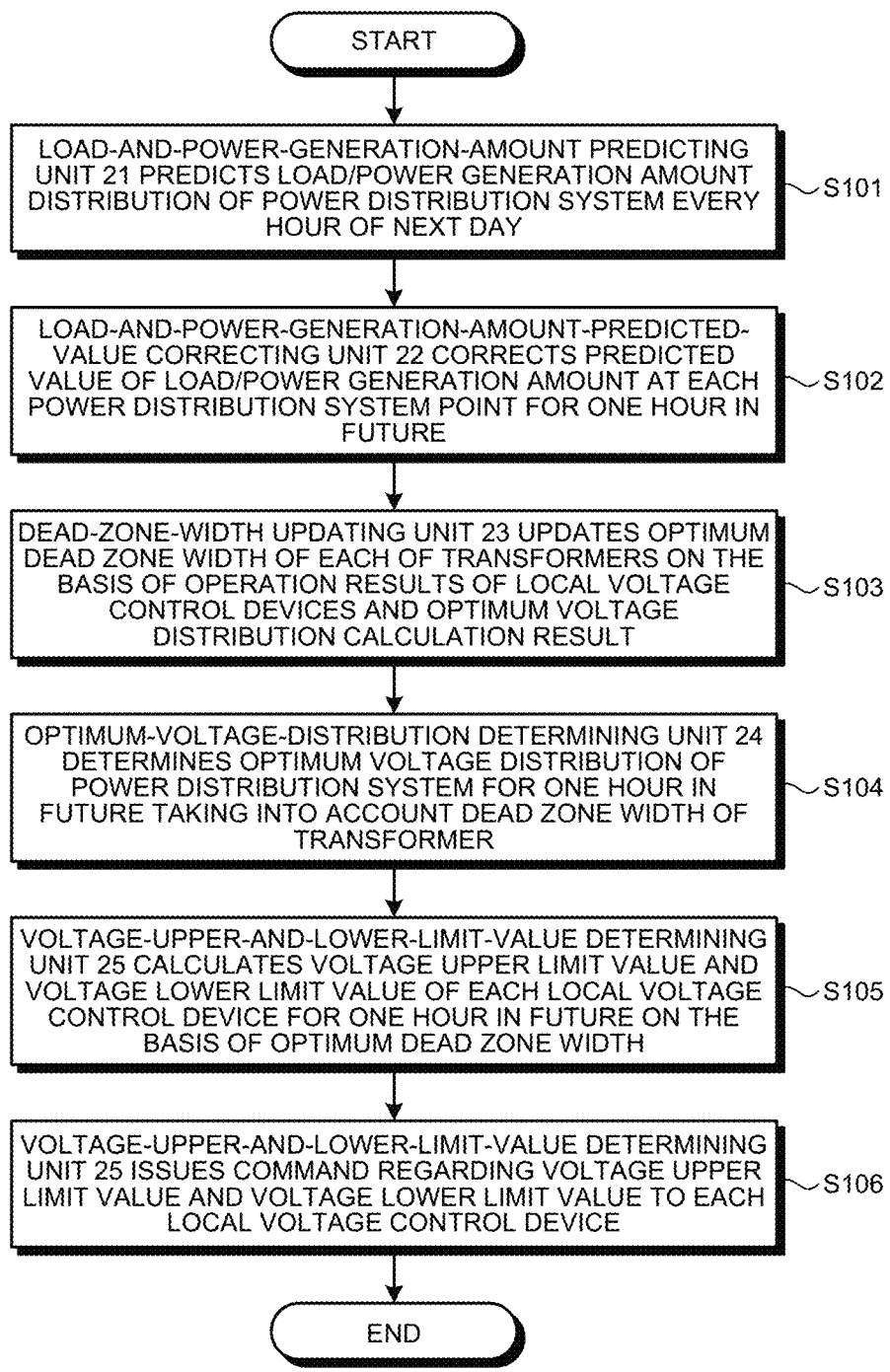
FIG. 5 is a flowchart for explaining the operation of the embodiment.

The operation of the present embodiment is explained with reference to FIG. 5. FIG. 5 is a flowchart for explaining the operation of the present embodiment.

First, each of the voltage-and-power-flow measuring devices 10 periodically measures a voltage and a power flow at the setting point and stores the voltage and the power flow data. Each of the voltage-and-power-flow measuring devices 10 transmits the averages of, for example, ten minutes of the measured voltage and power flow data to the centralized voltage control device 8 via the communication network 7. After receiving the averages of ten minutes of the voltage and power flow data with the transmission and reception unit 26, the centralized voltage control device 8 can calculate the load/power generation amount at each power distribution system point by calculating the difference in power flow average between the measurement points adjacent to each other. The centralized voltage control device 8 stores the loads/power generation amounts in the storing unit 27 as load and power generation amount data. The load/power generation amount (load and power generation amount data) is equivalent to, for example, the amount obtained by subtracting the power generation amount from a pure load and can take a positive or negative value according to the balance between the load and the power generation amount. That is, the load/power generation amount (load and power generation amount data) is equivalent to the difference between a pure load and the power generation amount at each power distribution system point. The load and power generation amount data is periodically stored and converted into a database.

Subsequently, as shown in FIG. 5, the load-and-power-generation-amount predicting unit 21 predicts, from the load and power generation amount data at each power distribution system point stored in the storing unit 27, for example, a load/power generation amount distribution of the power distribution system for each hour of the next day (step S101).

In this case, specifically, for example, in order to separately predict the load and the power generation amount, first, the load-and-power-generation-amount predicting unit 21 uses only load and power generation amount data in a fine-weather period of time and excludes a theoretical power generation amount (which is calculated from a solar power generation rated capacity, a solar panel setting angle, latitude, date and time, predicted temperature, and power generation efficiency) from the load and power generation amount data to calculate the actual load, which is a pure load.

Subsequently, the load-and-power-generation-amount predicting unit 21 collects actual loads for a plurality of days, calculates a correlation between the load and the temperature on the same day of the week (weekday/holiday division) and in the same period of time, and predicts the load at each power distribution system point for each hour of the next day from the correlation and predicted temperature of the next day. The power generation amount of the next day is the theoretical power generation amount. The load-and-power-generation-amount predicting unit 21 subtracts the predicted power generation amount from the predicted load and creates load and power generation amount data at each power distribution system point for each hour of the next day.

Note that, in the present embodiment, for example, the load/power generation amount distribution for each hour of the next day is predicted every day. However, not only this, but a load/power generation amount distribution for each fixed period in future can be predicted. Note that the one hour or the fixed period is equivalent to the centralized control cycle. Whereas the prediction of the load/power generation amount is performed, for example, every hour, the measurement values of the voltage and the power flow are, for example, the averages of ten minutes rather than the averages of one hour. This is for the purpose of, in calculating the correlation between the load and the temperature on the same day of the week (weekday/holiday division) and in the same period of time, increasing the number of pieces of measurement data to thereby increase the accuracy of the correlation and grasping the fluctuation state of the load during one hour. This can be used for grasping a period of time during which the load fluctuation is large in setting of the control limit of each voltage control apparatus at S301 in FIG. 6, which will be explained later. However, the measurement values of the voltages and the power flows can be, for example, averages of one hour.

Subsequently, the load-and-power-generation-amount-predicted-value correcting unit 22 corrects the predicted value of the load/power generation amount of the power distribution system for one hour in future (step S102). Specifically, the load-and-power-generation-amount-predicted-value correcting unit 22 compares, concerning the average of the load/power generation amount at each power distribution system point for one hour in the past, the actual value (calculated on the basis of the actual measurement value) and the predicted value to calculate ratio of the actual value to the predicted value and multiplies the predicted value of the load/power generation amount for one hour in future by the ratio to thereby correct the predicted value of the load/power generation amount at each system point for one hour in future. Consequently, it is expected that the accuracy of the predicted value is improved.

Subsequently, the dead-zone-width updating unit 23 updates the dead zone width for each of the local voltage control devices according to the operation results (control result information) from each local voltage control device and the calculation state of an optimum voltage distribution (step S103). Specifically, as explained above, when the number of times the tap position is changed during the determined time or the number of times the tap position is changed per fixed time, which is the control result information, is equal to or larger than the threshold, the dead-zone-width updating unit 23 widens the dead zone width. When a solution is not obtained in the calculation of the optimum voltage distribution (when the set dead zone width cannot be secured), the dead-zone-width updating unit 23 narrows the dead zone width. Note that, when the set dead zone width cannot be secured, this accurately means that voltage violation occurs at a downstream point even if the dead zone width is within the range of the dead zone width of the transformer. In this case, when the amount of voltage violation is equal to or larger than a fixed value, the dead-zone-width updating unit 23 determines that there is no solution according to the calculation of the optimum voltage distribution and narrows the dead zone width. As explained above, the minimum and the maximum can be set for the dead zone width. When the dead zone width calculated according to the control result information from each local voltage control device and the calculation state of the optimum voltage distribution as explained above falls below the minimum, the dead width zone can be set to the minimum. Conversely, when the dead zone width exceeds the maximum, the dead zone width can be set to the maximum. Note that, when the control result information from each local voltage control device cannot be acquired, at step S103, the dead-zone-width updating unit 23 does not change the dead zone width. Note that, when the control result information from each local voltage control device cannot be acquired, the dead zone width can be set to a standard value. As explained above, the standard value is, for example, a value equal to the voltage fluctuation by one-tap change.

Note that, in the example shown in FIG. 5, the update of the dead zone width is performed at step S103. However, the cycle for updating the dead zone width does not have to coincide with the centralized control cycle (e.g., one-hour cycle). When the cycle for updating the dead zone width (dead-zone-width update cycle) does not coincide with the centralized control cycle, the dead-zone-width updating unit 23 only has to update the dead zone width every dead-zone-width update cycle, store the updated dead zone width (latest dead zone width), and, at step S103 (which is carried out every centralized control cycle), input the latest dead zone width to the optimum-voltage-distribution determining unit 24. Note that the dead-zone-width update cycle is desirably equal to or longer than the centralized control cycle. When the dead-zone-width update cycle is longer than the centralized control cycle, an integrated value of the amount of voltage violation (voltage violation integrated value) according to calculation of the optimum voltage distribution within the dead-zone-width update cycle can be calculated. When the voltage violation integrated value is equal to or larger than a fixed value, the dead zone width can be narrowed. For example, when the centralized control cycle is set to one hour and the dead-zone-width update cycle is set to one day, the voltage violation integrated value is an integrated value of the voltage violation values according to calculation of the optimum voltage distribution for twenty-four times in total, the calculation being performed every hour.

Subsequently, the optimum-voltage-distribution determining unit 24 determines, on the basis of the predicted value of the load/power generation amount after the correction at each power distribution system point for one hour in future created at S102, an optimum voltage distribution of the power distribution system for one hour in future (step S104). Details of this processing will be explained later with reference to FIG. 6. Note that the processing at S102 can be omitted and the optimum-voltage-distribution determining unit 24 can determine the optimum voltage distribution of the power distribution system for one hour in future on the basis of the predicted value of the load/power generation amount at each power distribution system point for one hour in figure created at S101. At S101, the load-and-power-generation-amount predicting unit 21 predicts the load/power generation amount distribution for one hour in future on the basis of the measurement information transmitted from the voltage-and-power-flow measuring devices 10. However, not only this, but, for example, it is also possible that a database concerning load and power generation amount data is stored in the storing unit 27 in advance and the load-and-power-generation-amount predicting unit 21 predicts a load/power generation amount distribution with reference to the database. In this case, the voltage-and-power-flow measuring devices 10 do not have to be provided and the processing at S102 is omitted.

Subsequently, the voltage-upper-and-lower-limit-value determining unit 25 calculates the voltage upper limit value and the voltage lower limit value of each of the local voltage control devices for one hour in figure on the basis of the optimum voltage distribution of the power distribution system (step S105). Details of this processing will be explained later with reference to FIG. 7.

Subsequently, the voltage-upper-and-lower-limit-value determining unit 25 issues a command regarding the voltage upper limit value and the voltage lower limit value to each local voltage control device (step S106). Note that, when another voltage control apparatus is set on the downstream side of a voltage control apparatus, for example, when an SVR is set on the load side of an LRT (see the power distribution line 4-1), the voltage-upper-and-lower-limit-value determining unit 25 issues a command regarding the voltage upper and lower limit values to each local voltage control device on the downstream side first and specifies the order of control.

Each local voltage control device adjusts the amount of control of a corresponding voltage control apparatus, which is a control target, on the basis of the command regarding the voltage upper and lower limit values from the centralized voltage control device 8. Specifically, each local voltage control device adjusts the amount of control of a corresponding voltage control apparatus according to the necessity every local control cycle that is shorter than the centralized control cycle (one hour) such that a voltage is maintained between the voltage upper and lower limit values. Each local voltage control device updates and sets the voltage upper limit value and the voltage lower limit value every time the local voltage control device receives the command regarding the voltage upper and lower limit values from the centralized voltage control device 8 every centralized control cycle.

The local voltage control device that controls the voltage control apparatus of the transformer type transmits the number of times the tap position is changed during the predetermined time, which is caused by controlling a voltage such that it is maintained between the voltage upper and lower limit values, to the centralized voltage control device 8 as control result information.

Figure 6:
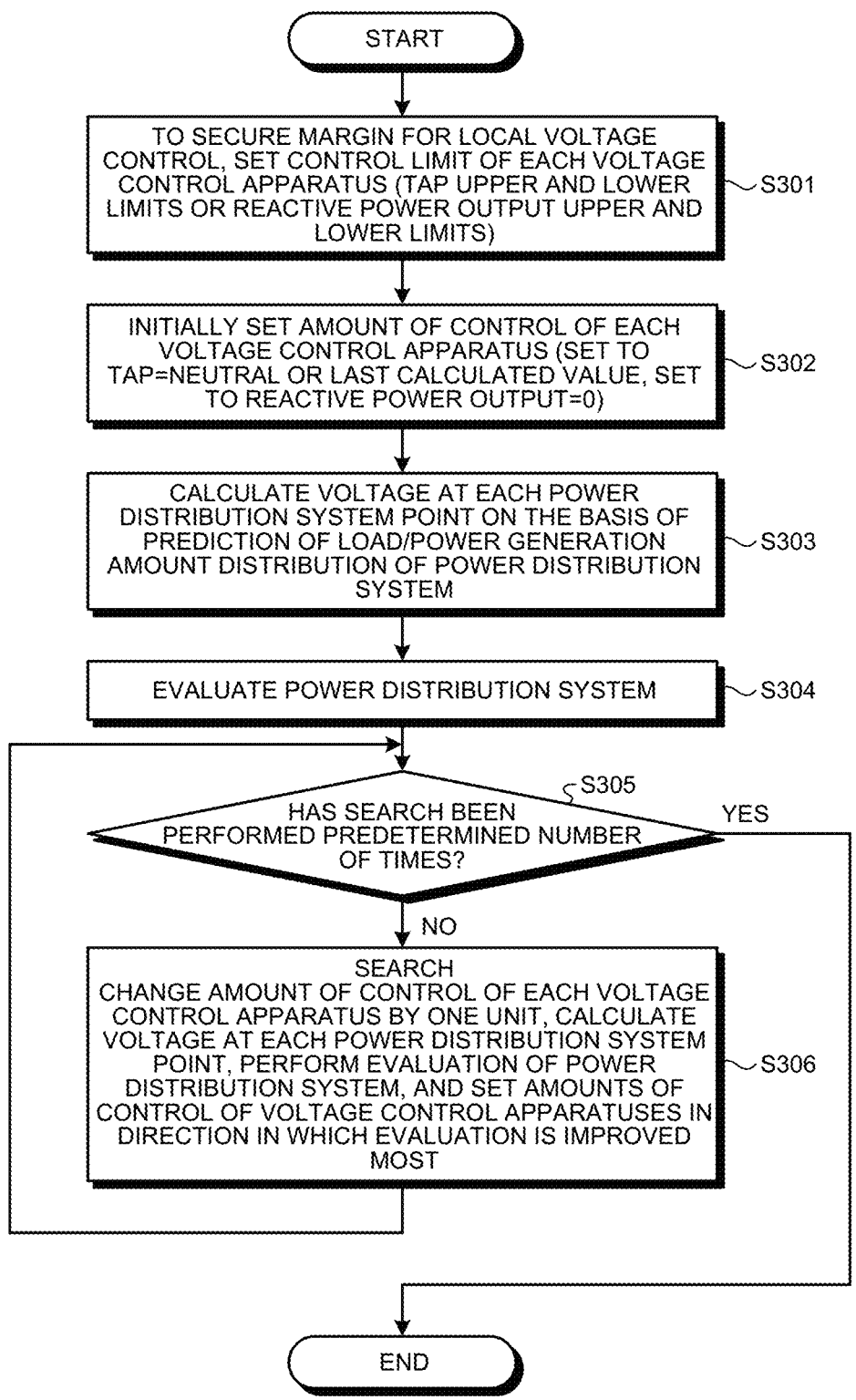
FIG. 6 is a flowchart for explaining details of processing at step S104 in FIG. 5.

Details of the processing at step S104 in FIG. 5 are explained with reference to FIG. 6. FIG. 6 is a flowchart for explaining the details of the processing at step S104 in FIG. 5 and represents a flow for calculating an optimum voltage distribution of the power distribution system for one hour in future.

First, in order to secure a margin of local control of each voltage control apparatus, the optimum-voltage-distribution determining unit 24 sets a control limit of each voltage control apparatus (in the case of the voltage control apparatus of the transformer type, tap upper and lower limits (dead zones), which are an upper limit and a lower limit in a range in which the same tap position is maintained and, in the case of the voltage control apparatus of the reactive power control type, reactive power output upper and lower limits) (step S301). In this case, concerning a period of time during which large voltage fluctuations are predicted, that is, a period of time during which load fluctuations are large (e.g., morning, before and after the lunch break, or a period of time in the light is turned on and off) and a period of time during which power generation fluctuations are large (e.g., daytime when a theoretical power generation amount is large), the optimum-voltage-distribution determining unit 24 secures a large margin of the local control taking into account directionality of fluctuations such as rising or falling tendency. As the tap upper and lower limits (dead zones) of the voltage control apparatuses of the transformer type, the optimum-voltage-distribution determining unit 24 sets the latest dead zone width input from the dead-zone-width updating unit 23.

Subsequently, the optimum-voltage-distribution determining unit 24 initially sets the amount of control of each voltage control apparatus (step S302). In this case, the optimum-voltage-distribution determining unit 24 sets, in the case of the voltage control apparatus of the transformer type, the tap position to, for example, a calculated value during optimum voltage distribution calculation performed one hour earlier (or a neutral value when there is no last time calculated value) and sets, in the case of the voltage control apparatus of the reactive power control type, the reactive power voltage to, for example, 0 (nil).

Subsequently, the optimum-voltage-distribution determining unit 24 performs power flow calculation with the set amount of control (the tap position and the reactive power amount) of each voltage control apparatus on the basis of the prediction of the load/power generation distribution at each power distribution system point and calculates a voltage at each power distribution system point (step S303).

Subsequently, the optimum-voltage-distribution determining unit 24 evaluates the power distribution system on the basis of the result of the power flow calculation (step S304). Specifically, the optimum-voltage-distribution determining unit 24 evaluates the power distribution system by evaluating the values of evaluation functions (objective functions) set concerning evaluation items of the power distribution system. The first priority evaluation item is the amount of violation (deviation) of the voltage at each power distribution system point from a proper voltage range (a proper voltage upper limit value and a proper voltage lower limit value). That is, first, the optimum voltage distribution is determined such that the sum of the amounts of violation (deviation) of the voltages at the power distribution system points from the proper voltage range is minimized. The second priority evaluation item is, for example, a voltage margin at each power distribution system point (margin to the proper voltage upper and lower limit values). When the voltage margin at each power distribution system point is small, the voltage upper and lower limit widths of the voltage control apparatuses decrease and thus the voltage control apparatuses frequently operate with slight voltage fluctuations. Therefore, evaluation is higher as the sum of the voltage margins is larger. The third priority evaluation item can be the sum of the amounts of change of the amount of control of the voltage control apparatus from the initial setting value. The amount of change of the amount of control of the voltage control apparatus from the initial setting value is the amount of reactive power output in the case of the voltage control apparatus of the reactive power control type and is a difference of the tap position from the initial setting tap position in the case of the voltage control apparatus of the transformer type. A reduction in the sum of the amounts of change leads to a reduction in the number of operations of the voltage control apparatus. Further, the fourth priority evaluation item can be a power transmission loss (active power loss+reactive power loss) of the entire power distribution system. Evaluation is higher as the transmission loss is smaller. Note that the active power loss occupies most of the power transmission loss. The loss is smaller as the voltage is higher; however, the voltage margin (the upper limit value side) at each power distribution system point of the second priority decreases. Therefore, this evaluation item has a meaning of evaluation when there is a considerable margin to the voltage upper and lower limits at each power distribution system point.

The evaluation function can be set concerning the first priority evaluation item. However, the evaluation function can also be set concerning two or more items among the first to fourth priority evaluation items. In this case, a function obtained by weighting each evaluation function and calculating the sum of the evaluation functions is set as an overall evaluation function. Further, a higher-order priority item can also be included in the evaluation function according to the power distribution system. The evaluation function can be configured to be most optimized (evaluated highest), for example, when the evaluation function takes a minimum.

For example, when the evaluation function is set on the basis of all the first to fourth priority evaluation items, the evaluation function can be set as indicated by Formula (1) below. Wp, W1, W2, W3, and W4 indicate weights.

$$\begin{aligned}
&\text{Evaluation function value} = \text{sum of the amounts of} \\
&\quad \text{violation of the voltage upper and lower limits} \\
&\quad \text{at the power distribution system points} \times Wp \\
\\
&+ \text{maximum of upper-limit-side voltage margin deviation at the power distribution system points for each transformer} \times W1 \\
\\
&+ \text{maximum of lower-limit-side voltage margin deviation at the power distribution system points for each transformer} \times W1 \\
\\
&+ \text{transformer target voltage change amount from the last command time} \times W2 \\
\\
&+ \text{reactive power command absolute value} \times W3 + \\
&\quad \text{power transmission loss} \times W4
\end{aligned} \quad (1)$$

Subsequently, the optimum-voltage-distribution determining unit 24 determines whether a search is perform a predetermined number of times (step S305). When the search is performed the predetermined number of times (Yes at step S305), the optimum-voltage-distribution determining unit 24 ends the processing. When the search is not performed the predetermined number of times (No at step S305), the optimum-voltage-distribution determining unit 24 proceeds to processing at step S306.

Subsequently, at step S306, the optimum-voltage-distribution determining unit 24 changes the amount of control of each voltage control apparatus, for example, by one unit (raise/lower the tap, for example, by one stage or increase/reduce the reactive power, for example, by 5% of rated reactive power), calculates a voltage at each power distribution system point (same as step S303), and evaluates the power distribution system (same as step S304). The optimum-voltage-distribution determining unit 24 performs the above process for all the voltage control apparatuses, compares the evaluation results, and changes the setting of the amount of control of each voltage control apparatus such that evaluation is improved most (step S306). Concerning an algorithm of optimization, for example, a method disclosed in Japanese Patent Application Laid-Open No. 2010-250599 or the like can be used. Note that, concerning the voltage control apparatuses capable of continuously changing the amount of control as in reactive power control of the SVC or the like, the same effects are obtained even when the optimum amount of control is calculated by quadratic programming, which is one of continuous optimization methods. After carrying out step S306, the optimum-voltage-distribution determining unit 24 returns to step 305.

Note that, when the search is performed the predetermined number of times and the amount of control with which the evaluation is improved most is set, voltage violation remains in some cases. In this case, the dead zone width of the voltage control apparatus of the transformer type can be narrowed to carry out step S104 again. Alternatively, it is also possible that step S104 is not carried out again and, as explained above, the amount of voltage violation is recorded as an integrated value and, when the voltage violation integrated value is equal to or larger than a fixed value, the dead zone width is narrowed.

Consequently, after performing the search the predetermined number of times, the optimum-voltage-distribution determining unit 24 can determine, as a best solution for optimizing a value of the evaluation function, an optimum voltage distribution of the power distribution system and the optimum amount of control of each voltage control apparatus for one hour in future.

Details of the processing at S105 in FIG. 5 are explained. First, concerning the local voltage control device 15, because a control target is the voltage control apparatus of the transformer type, a value obtained by subtracting a half of the dead zone width from the optimum voltage is set as a voltage lower limit value and a value obtained by adding a half of the dead zone width to the optimum voltage is set as a voltage upper limit value. The same applies to the other local voltage control devices that control the voltage control apparatuses of the transformer type.

Concerning the voltage control apparatus of the reactive power control type, for example, as explained below, a voltage control responsible range is set, and voltage upper and lower limit values can be determined on the basis of a minimum value (um_min) among the voltage lower limit margins, which are each the absolute value of the difference between the optimum value and a lower limit value V_min of a proper voltage, and a minimum value (lm_min) among the voltage upper limit margins, which are each the absolute value of the difference between the optimum voltage and an upper limit value V_max of the proper voltage, in the voltage control responsible range.

Specifically, the voltage control apparatus of the reactive power control type sets, when the voltage control apparatus of the transformer type is present on the power supply side (upstream side) of the voltage control apparatus, a range up to the load side (downstream side) of the transformer of the voltage control apparatus of the transformer type and a range on the load side (downstream side) of the voltage control apparatus as the voltage control responsible range. When still another voltage control apparatus is present on the load side (downstream side), the voltage control apparatus of the reactive power control type includes, in the voltage control responsible range, a range up to the power supply side (upstream side) of the other voltage control apparatus.

For example, a voltage control responsible range of the local voltage control device 16 is a range from the load side of the voltage control apparatus 5 to the next voltage control apparatus (not shown in the figure) on the load side (downstream side) of the voltage control apparatus 6 and includes a low voltage system (not shown in FIG. 1) connected to the power distribution line 4-1. In the voltage control responsible range of the local voltage control device 16, a minimum value among the voltage lower limit margins, which are each the absolute value of the difference between the optimum voltage and the lower limit value V_min of the proper voltage, is represented as um_min and a minimum value among the voltage upper limit margins, which are each the absolute value of the difference between the optimum voltage and the upper limit value V_max of the proper voltage, is represented as lm_min. In this case, the voltage-upper-and-lower-limit-value determining unit 25 sets, as a voltage upper limit value of a control target voltage range, a value obtained by adding um_min to the value of the optimum voltage of the voltage control apparatus 6 and sets, as a voltage lower limit value of the control target voltage range, a value obtained by subtracting lm_min from the value of the optimum voltage of the voltage control apparatus 6. When the voltage control apparatus is a reactive power compensation type, the value of the optimum voltage of the voltage control apparatus 6 is an optimum voltage at a power distribution system interconnection point of the voltage control apparatus 6.

In this way, the voltage upper and lower limit values are determined taking into account not only the voltage upper and lower limit margins in the vicinity of the setting place of the voltage control apparatus 6 but also the voltage upper and lower limit margins at the points in the voltage control responsible range; therefore, although the local voltage control device 16 itself locally controls the voltage control apparatus 6 within the control target voltage range, it is possible to maintain the proper voltage in a wide voltage control responsible range.

Figure 7:
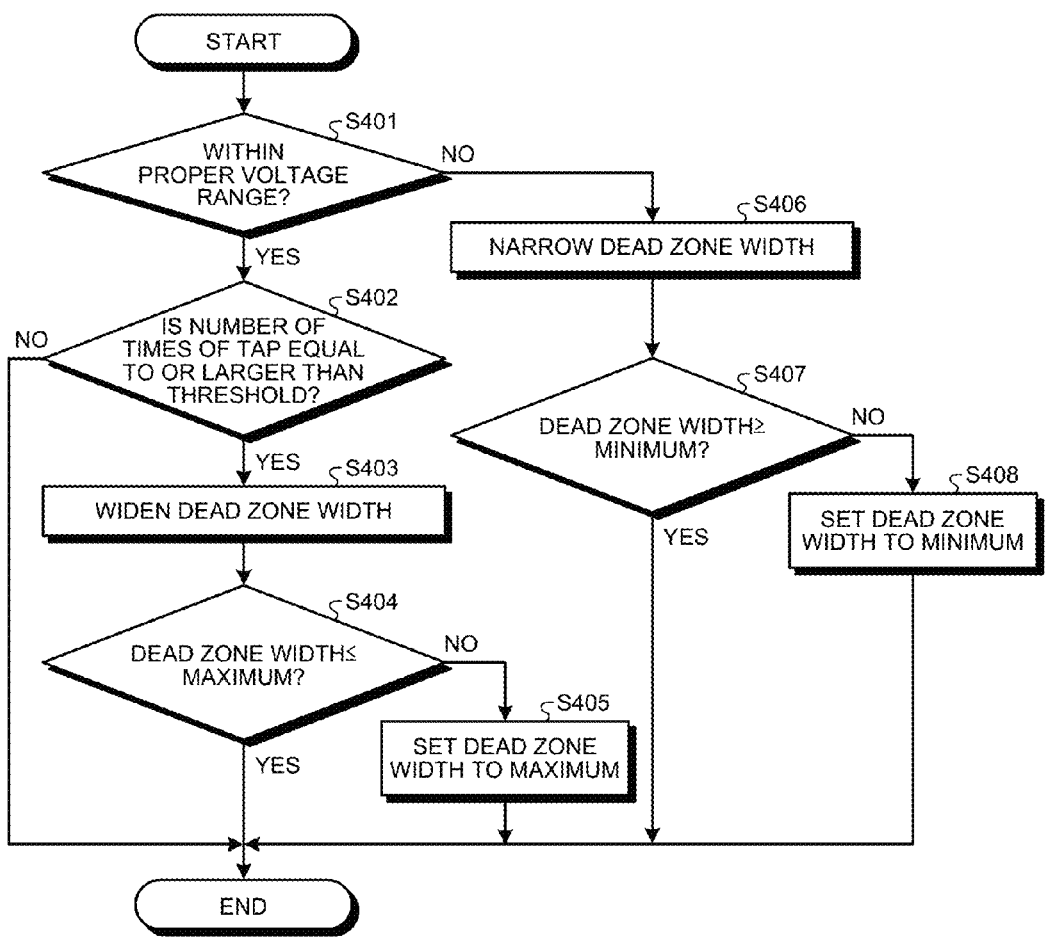
FIG. 7 is a flowchart showing an example of a procedure for updating the dead zone width in the embodiment.

An updating method for the dead zone width in the present embodiment is explained next in detail. FIG. 7 is a flowchart showing an example of a dead zone width update procedure in the present embodiment. The dead-zone-width updating unit 23 executes processing shown in FIG. 7 concerning each voltage control apparatus of the transformer type every fixed cycle (dead-zone-width update cycle).

First, the dead-zone-width updating unit 23 determines whether the calculation result of an optimum voltage distribution is within a proper voltage range (no voltage violation occurs) (step S401). The dead-zone-width updating unit 23 can determine whether the calculation result is within the proper voltage range by determining, according to the result of a single calculation of the optimum voltage distribution (in a centralized control cycle), whether voltage violation occurs. Alternatively, when the dead-zone-width update cycle is longer than the centralized control cycle, as explained above, the dead-zone-width updating unit 23 can calculate a voltage violation integrated value in advance and determine whether the calculation result is within the proper voltage range according to whether the voltage violation integrated value is smaller than a fixed value (e.g., 100 volts). Further, the dead-zone-width updating unit 23 can determine whether voltage violation occurs according to whether an optimum voltage obtained from the optimum voltage distribution is within the proper voltage range. The dead-zone-width updating unit 23 can add a certain degree of margin to the optimum voltage (when the optimum voltage is close to the upper limit value of the proper voltage range) or subtract a certain degree of margin from the optimum voltage (when the optimum voltage is close to the lower limit value of the proper voltage range) and determine whether voltage violation occurs according to whether the value after the addition or the subtraction is within the proper voltage range.

When the calculation result is within the proper voltage range (Yes at step S401), the dead-zone-width updating unit 23 determines whether the number of times the tap position is changed in a processing target voltage control apparatus (hereinafter abbreviated as the number of times of tap) is equal to or larger than a threshold (step S402). The threshold for the number of times of tap can be set in any way. For example, the tap position change can be set to be performed about once per hour. Therefore, for example, when the dead-zone-width update cycle is one day, the threshold is about twenty-four times. When the dead zone width update is performed at determined time in one day such as 10 o'clock and 20 o'clock, the threshold is set to an appropriate threshold according to the time from the last time or set to a threshold corresponding to the number of times of tap per fixed time.

When the number of times of tap is equal to or larger than the threshold (Yes at step S402), the dead-zone-width updating unit 23 widens the dead zone width of the processing target voltage control apparatus (step S403). As a method of widening the dead zone width, there are various methods as explained above. As an example, the dead zone width is increased by a fixed amount (e.g., 10 volts). When the number of times the tap position is changed within the determined time or the number of times the tap position is changed per fixed time is equal to or larger than the threshold, the dead-zone-width updating unit 23 widens the dead zone width.

After widening the dead zone width, the dead-zone-width updating unit 23 determines whether the dead zone width (the widened dead zone width) is equal to or smaller than a maximum (step S404). As explained above, the maximum can be set to, for example, a value equivalent to approximately two-tap change. When the dead zone width is equal to or smaller than the maximum value (Yes at step S404), the dead-zone-width updating unit 23 ends the processing without changing the value of the dead zone width. When the dead zone width exceeds the maximum (No at step S404), the dead-zone-width updating unit 23 sets the dead zone width to the maximum (step S405) and ends the processing.

On the other hand, when the calculation result is not within the proper voltage range at step S401 (No at step S401), the dead-zone-width updating unit 23 narrows the dead zone width of the processing target voltage control apparatus (step S406). As a method of narrowing the dead zone width, there are various methods as explained above. As an example, the dead zone width is reduced by a fixed amount (e.g., 10 volts).

After narrowing the dead zone width, the dead-zone-width updating unit 23 determines whether the dead zone width (the narrowed dead zone width) is equal to or larger than a minimum (step S407). When the dead zone width is equal to or larger than the minimum (Yes at step S407), the dead-zone-width updating unit 23 ends the processing without changing the value of the dead zone width. When the dead zone width is smaller than the minimum (No at step S407), the dead-zone-width updating unit 23 sets the dead zone width to the minimum (step S408) and ends the processing.

When the number of times of tap is smaller than the threshold at step S402 (No at step S402), the dead-zone-width updating unit 23 ends the processing without changing the value of the dead zone width.

The dead-zone-width updating unit 23 carries out the above processing concerning each voltage control apparatus of the transformer type and updates the dead zone width. When the calculation result of the optimum voltage distribution is within the proper voltage range and the number of times of tap is smaller than the threshold, the dead zone width is not actually changed in some cases. The dead zone width, including such a case, after the update processing of the dead zone width is referred to as a dead zone width after update. The dead-zone-width updating unit 23 retains the dead zone width after update and uses the dead zone width after update as an input of calculation of an optimum voltage distribution carried out every centralized control cycle (step S104 in FIG. 5). Concerning the voltage control apparatuses of the transformer type, the dead zone width is reflected when the voltage upper and lower limit values are calculated and the voltage upper and lower limit values are transmitted to each local voltage control device, whereby the dead zone width is set in each local voltage control device.

Note that, in the example explained above, when the calculation result of the optimum voltage distribution is not within the proper voltage range, the dead zone width is narrowed. However, in addition, the dead zone width can be narrowed when the number of times of tap is equal to or smaller than a predetermined lower limit value.

As explained above, in the present embodiment, the dead zone width is set concerning the voltage control apparatuses of the transformer type. The centralized voltage control device 8 calculates an optimum voltage distribution within a fixed period in future (a period within the centralized control cycle) reflecting the dead zone width. Concerning the voltage control apparatuses of the reactive power adjustment type, the centralized voltage control device 8 determines, on the basis of the relation between the optimum voltage distribution and the proper voltage range, voltage upper and lower limit value command to be issued to each local voltage control device taking into account the voltage upper and lower margin at each point in the voltage control responsible range for each local voltage control device. Concerning the voltage control apparatuses of the transformer type, the centralized voltage control device 8 determines voltage upper and lower limit values on the basis of the optimum voltage and the dead zone width. The centralized voltage control device 8 updates the dead zone width on the basis of the number of times of tap of the voltage control apparatuses of the transformer type and the presence or absence of voltage violation in the calculation result of the optimum voltage distribution. On the other hand, the local voltage control device adjusts, on the basis of the voltage upper and lower limit value command received from the centralized voltage control device 8 via the communication network 7, the amount of control every local control cycle that is shorter than the centralized control cycle period so as to maintain the voltage of a voltage control apparatus that is a control target of the local voltage control device between the voltage upper and lower limit values. The local voltage control device that controls the voltage control apparatus of the transformer type transmits the number of times of tap within determined time to the centralized voltage control device 8 as control result information. In this way, the centralized voltage control device 8 issues only a command regarding the voltage upper and lower limit values to each local voltage control device. Each local voltage control device autonomously performs local control according to the command received from the centralized voltage control device 8. The centralized control by the centralized voltage control device 8 and the local control by each local voltage control device are divided as roles.

Consequently, the control itself of the voltage control apparatuses is locally carried out by the local voltage control devices. Therefore, it is possible to maintain a voltage following even voltage fluctuations of the power distribution system due to a factor that is hard to predict such as a solar power generation amount change. That is, it is possible to cope with sudden voltage fluctuations only with the local voltage control devices without waiting for communication with the centralized voltage control device 8. Therefore, it is possible to perform early voltage control.

In the present embodiment, the communication between the centralized voltage control device 8 and each local voltage control device only has to be performed every centralized control cycle, which is, for example, one hour. Therefore, compared with, for example, when a voltage command is transmitted every local control cycle, communication frequency is reduced and a communication load is not increased.

In this way, according to the present embodiment, it is possible to, without increasing a communication load, maintain a voltage following even voltage fluctuations of the power distribution system due to a factor that is hard to predict such as a solar power generation amount change. Note that a method for determining voltage upper and lower limit values concerning the voltage control apparatuses of the reactive power type in the centralized voltage control device 8 can be a method of determining voltage upper and lower limit values other than the method in the present embodiment. Even in such a case, the object explained above can be attained as long as the centralized control by the centralized voltage control device 8 and the local control by each local voltage control device are divided as roles. However, reliability of voltage control of the power distribution system is improved by determining voltage upper and lower limit values as in the present embodiment.

In the present embodiment, the dead zone width is updated on the basis of the number of times of tap of the voltage control apparatuses of the transformer type and the presence or absence of voltage violation in the calculation result of the optimum voltage distribution. Therefore, it is possible to suppress an increase in the number of times of taps and extend the life of the tap device while suppressing occurrence of voltage violation.

Note that, in the present embodiment, the load/power generation amount is predicted and the command regarding voltage upper and lower limit values is issued to the local voltage control devices, for example, every hour. However, not only this, but the load/power generation amount can be predicted and the command regarding voltage upper and lower limit values can be issued, for example, every several tens of minutes (e.g., thirty minutes) to several hours or at a time interval equal to or longer than several hours. Further, the command regarding voltage upper and lower limit values can be transmitted to the local voltage control devices only when the voltage upper and lower limit values greatly change. Consequently, a communication load is further reduced.

In preparation for a case in which a local voltage control device that cannot receive the voltage upper and lower limit value command from the centralized voltage control device 8 every centralized control cycle because of a communication failure or the like, it is also possible to transmit the voltage upper and lower limit values equivalent to multiple time slots (e.g., for the next one day) beforehand from the centralized voltage control device 8 to the local voltage control devices and store the voltage upper and lower limit values in the local voltage control devices. In this case, when communication abnormality of a certain local voltage control device occurs, the local voltage control device can operate on the basis of the stored voltage upper and lower limit values. The centralized voltage control device 8 can estimate the operation of the local voltage control device. Note that, in this case, the processing at step S102 in FIG. 5 is omitted.

INDUSTRIAL APPLICABILITY

As explained above, the voltage monitoring control device, the voltage control device, and the voltage monitoring control method according to the present invention are useful for a system that controls the voltage of a power distribution system.

REFERENCE SIGNS LIST

1, 5, 6 voltage control apparatus, 2 bus, 3-1, 3-2 breaker, 4-1, 4-2 power distribution line, 7 communication network, 8 centralized voltage control device, 10 voltage-and-power-flow measuring device, 11, 15, local voltage control device, 20 control unit, 21 load-and-power-generation-amount predicting unit, 22 load-and-power-generation-amount-predicted-value correcting unit, dead-zone-width updating unit, 24 optimum-voltage-distribution determining unit, 25 voltage-upper-and-lower-limit-value determining unit, 26 transmission and reception unit, 27 storing unit.

The invention claimed is:

1. A voltage monitoring control device that is connected to each of a plurality of local voltage control devices via a communication network, the local voltage control devices being respectively connected to a plurality of voltage control apparatuses that are connected to a power distribution line of a high voltage system and control a voltage of the power distribution line and adjusting an amount of control of the voltage control apparatuses every second cycle that is shorter than a first cycle such that a voltage value controlled by the voltage control apparatuses is maintained within a range between a voltage upper limit value and a voltage lower limit value that are updated every first cycle, the device comprising:
   a transmission and reception unit that receives number of times a tap position is changed within determined time or the number of times a tap position is changed per fixed time concerning a voltage control apparatus of a transformer type, which controls a voltage by changing a tap position, among the voltage control apparatuses to which the local voltage control devices are connected, the number of times a tap position is changed being transmitted from the local voltage control devices;
   a dead-zone-width updating unit that increases, concerning the voltage control apparatus of a transformer type, a dead zone width, which is a width of a range between the voltage upper limit value and the voltage lower limit value of the voltage control apparatus, when the number of times a tap position is changed within the determined time or the number of times a tap position is changed per fixed time is equal to or larger than a threshold; and
   a voltage-upper-and-lower-limit-value determining unit that determines the voltage upper limit value and the voltage lower limit value that are updated every first cycle in each of the local voltage control devices and issues a command regarding the voltage upper limit value and the voltage lower limit value to each of the local voltage control devices via the communication network.

2. The voltage monitoring control device according to claim 1, wherein the dead-zone-width updating unit increases the dead zone width by adding a fixed amount set in advance to the dead zone width.

3. The voltage monitoring control device according to claim 1, wherein the dead-zone-width updating unit increases the dead zone width by multiplying the dead zone width by a fixed ratio set in advance.

4. The voltage monitoring control device according to claim 1, wherein the dead-zone-width updating unit reduces the dead zone width when the number of times a tap position is changed is equal to or smaller than a lower limit value set in advance.

5. The voltage monitoring control device according to claim 4, wherein the dead-zone-width updating unit reduces the dead zone width by subtracting a fixed amount set in advance from the dead zone width.

6. The voltage monitoring control device according to claim 4, wherein the dead-zone-width updating unit reduces the dead zone width by multiplying the dead zone width by a fixed ratio set in advance.

7. The voltage monitoring control device according to claim 1, further comprising:
 a load-and-power-generation-amount predicting unit that predicts, every first cycle, a load and power generation amount distribution representing a difference between a pure load and a power generation amount at each point of a power generation system; and
 an optimum-voltage-distribution determining unit that determines an optimum voltage distribution within a period of the first cycle by calculating a current power flow on a basis of the load and power generation amount distribution predicted by the load-and-power-generation-amount predicting unit and searching for a best solution for optimizing a value of an evaluation function set concerning an evaluation item of the power distribution system, wherein
 the dead-zone-width updating unit calculates a voltage violation integrated amount, which is an integrated amount of an amount of deviation of a voltage outside a proper voltage range, on a basis of the optimum voltage distribution and reduces the dead zone width when the voltage violation integrated amount is equal to or larger than a fixed amount.

8. The voltage monitoring control device according to claim 7, wherein the dead-zone-width updating unit reduces the dead zone width by subtracting a fixed amount set in advance from the dead zone width.

9. The voltage monitoring control device according to claim 7, wherein the dead-zone-width updating unit reduces the dead zone width by multiplying the dead zone width by a fixed ratio set in advance.

10. The voltage monitoring control device according to claim 1, wherein the dead-zone-width updating unit updates the dead zone width every third cycle that is equal to or longer than the first cycle.

11. The voltage monitoring control device according to claim 10, wherein the first cycle is several tens of minutes to several hours and the third cycle is one day.

12. The voltage monitoring control device according to claim 11, wherein the determined time is one day.

13. A voltage control device that is connected to a voltage control apparatus, which controls a voltage of a power line by changing a tap position, and that communicates with a voltage monitoring control device, the voltage control device being configured to:
 transmit control result information that is information on number of times a tap position is changed by the voltage control apparatus, to the voltage monitoring control device; and
 adjust an amount of control of the voltage control apparatus such that a voltage value controlled by the voltage control apparatus is maintained within a range between a voltage upper limit value and a voltage lower limit value that are determined by the voltage monitoring control device on a basis of the control result information.

14. The voltage monitoring control device according to claim 13, wherein the voltage control device is configured to count a number of times a tap position is changed within a determined time or per fixed time in the voltage control apparatus as the control result information, and transmit the number of times a tap position is changed, to the voltage monitoring control device.

15. A voltage monitoring and control method in a power distribution system including a plurality of voltage control apparatuses that are connected to a power distribution line of a high voltage system and control a voltage of the power distribution line, local voltage control devices that are respectively connected to the voltage control apparatuses and adjust an amount of control of the voltage control apparatuses such that a voltage value controlled by the voltage control devices is maintained, a voltage monitoring control device, and a communication network that connects the voltage monitoring control device and the local voltage control devices, the method comprising:
 determining, every first cycle, a voltage upper limit value and a voltage lower limit value indicating a control range in each of the local voltage control devices and issuing a command regarding the voltage upper limit value and the voltage lower limit value to each of the local voltage control devices via the communication network;
 adjusting an amount of control of a voltage control apparatus that is a control target of the local voltage control device every second cycle that is shorter than the first cycle such that a voltage value controlled by the voltage control apparatus is maintained within a range between the voltage upper limit value and the voltage lower limit value;
 counting number of times a tap position is changed within determined time or per fixed time in a voltage control apparatus connected to the local voltage control device connected to the voltage control apparatus of a transformer type, which controls a voltage by changing a tap position, among the voltage control apparatuses, and transmitting the number of times a tap position is changed to the voltage monitoring control device; and
 increasing, concerning a voltage control apparatus of a transformer type, which controls a voltage by changing a tap position, among the voltage control apparatuses, a dead zone width, which is a width of a range between the voltage upper limit value and the voltage lower limit value of the voltage control apparatus, when the number of times a tap position is changed within the determined time or the number of times a tap position is changed per fixed time is equal to or larger than a threshold.

* * * * *